(12) United States Patent
Noebauer et al.

(10) Patent No.: US 11,158,569 B2
(45) Date of Patent: Oct. 26, 2021

(54) SEMICONDUCTOR COMPONENT AND SEMICONDUCTOR PACKAGE

(71) Applicant: Infineon Technologies Austria AG, Villach (AT)

(72) Inventors: Gerhard Noebauer, Villach (AT); Ashita Mirchandani, Torrance, CA (US)

(73) Assignees: Infineon Technologies Austria AG, Villach (AT); Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/801,646

(22) Filed: Feb. 26, 2020

(65) Prior Publication Data

US 2020/0273788 A1   Aug. 27, 2020

(30) Foreign Application Priority Data

Feb. 27, 2019   (EP) .................................... 19159762

(51) Int. Cl.
*H01L 23/498*    (2006.01)
*H01L 23/00*     (2006.01)

(52) U.S. Cl.
CPC .. *H01L 23/49844* (2013.01); *H01L 23/49827* (2013.01); *H01L 24/05* (2013.01); *H01L 2224/0237* (2013.01)

(58) Field of Classification Search
CPC ......... H01L 23/49562; H01L 23/49575; H01L 23/49827; H01L 23/49844; H01L 24/05; H01L 25/072; H01L 2224/0237
See application file for complete search history.

(56) References Cited

U.S. PATENT DOCUMENTS

| 2007/0132079 | A1 | 6/2007 | Otremba et al. |
| 2007/0228534 | A1* | 10/2007 | Uno ........................ H01L 23/50 257/678 |
| 2010/0059875 | A1* | 3/2010 | Sato ........................ H01L 24/33 257/690 |
| 2015/0001692 | A1 | 1/2015 | Tsai et al. |

FOREIGN PATENT DOCUMENTS

| EP | 2463904 A2 | 6/2012 |
| JP | H07193186 A | 7/1995 |
| JP | H11340272 A | 12/1999 |

\* cited by examiner

*Primary Examiner* — Allan R Wilson
(74) *Attorney, Agent, or Firm* — Murphy, Bilak & Homiller, PLLC

(57) ABSTRACT

In an embodiment, a semiconductor package includes at least one die pad, a plurality of outer contacts, a first semiconductor device and a second semiconductor device. The second semiconductor device includes a first transistor device having a source electrode, a gate electrode, a drain electrode, a front surface, and a rear surface. A front metallization is positioned on the front surface and a rear metallization on the rear surface of the second semiconductor device. The front metallization includes a first power contact pad coupled to the source electrode and mounted on the at least one die pad. The rear metallization includes a second power contact pad electrically coupled to the drain electrode, and an auxiliary lateral redistribution structure electrically insulated from the second power contact pad and the drain electrode. The first semiconductor device is electrically coupled to the auxiliary lateral redistribution structure.

15 Claims, 4 Drawing Sheets

SEMICONDUCTOR COMPONENT AND SEMICONDUCTOR PACKAGE

BACKGROUND

Transistors used in power electronic applications are typically fabricated with silicon (Si) semiconductor materials. Common transistor devices for power applications include Si CoolMOS®, Si Power MOSFETs, and Si Insulated Gate Bipolar Transistors (IGBTs). These transistor devices may be connected together to provide circuits or sections of circuits. For example, two transistor devices may be electrically connected to form a half-bridge circuit. Such circuits typically require control circuitry which may be used to switch the transistors. Control circuitry may include gate driver circuitry.

Transistor devices and a device with control circuitry may be accommodated within a single semiconductor package which may have a standard package outline. However, providing the connections between the devices to from the desired circuit has some challenges due to the limited space available space within the package. EP 2 463 904 A2 discloses a multi-chip Power Quad Flat No-lead package in which a leadframe of the package is utilized for electrical interconnections. However, improvements to packages including more than one semiconductor device are desirable.

SUMMARY

In an embodiment, a semiconductor package is provided that comprises at least one die pad, a plurality of outer contacts, a first semiconductor device and a second semiconductor device. The second semiconductor device comprises a first transistor device having a source electrode, a gate electrode and a drain electrode, a front surface and a rear surface. A front metallization is positioned on the front surface and a rear metallization on the rear surface of the second semiconductor device. The front metallization comprises a first power contact pad coupled to the source electrode, the first power contact pad being mounted on the die pad. The rear metallization comprises a second power contact pad electrically coupled to the drain electrode and an auxiliary lateral redistribution structure that is electrically insulated from the second power contact pad and the drain electrode. The first semiconductor device is electrically coupled to the auxiliary lateral redistribution structure.

In an embodiment, a semiconductor component is provided that comprises a transistor device. The transistor device comprises a front surface and a rear surface, a source electrode, a gate electrode and a drain electrode, a front metallization on the front surface and a rear metallization on the rear surface. The rear metallization comprises a second power contact pad arranged on and electrically coupled to the drain electrode and an auxiliary lateral redistribution structure that is electrically insulated from the second power contact pad and the drain electrode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
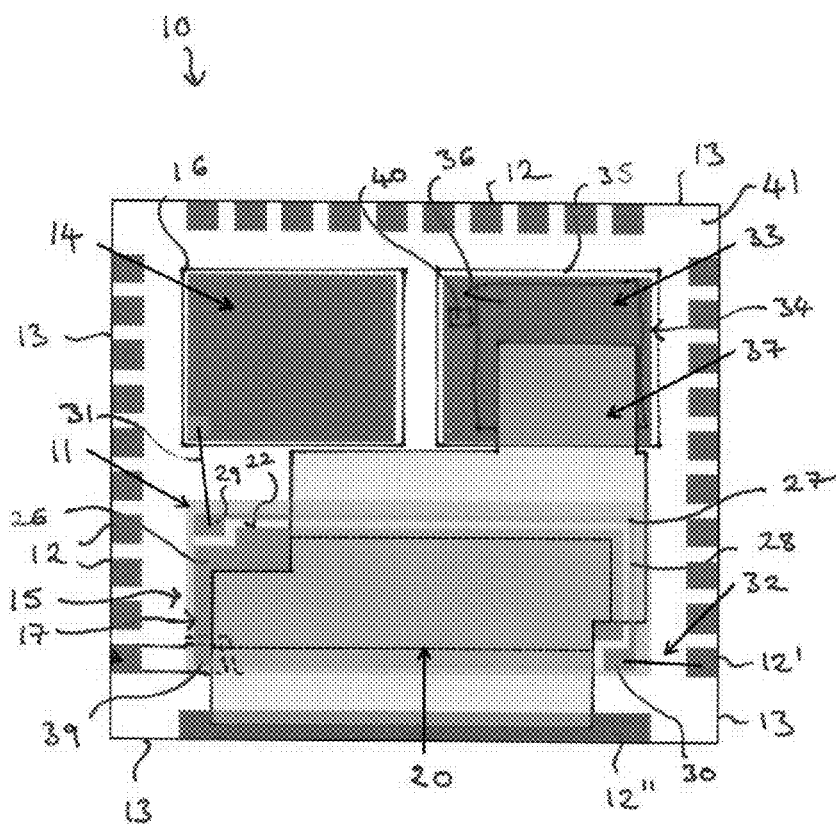
FIG. 1a illustrates a top view and FIG. 1b a cross-sectional view of a semiconductor package according to an embodiment.
Figure 1B:
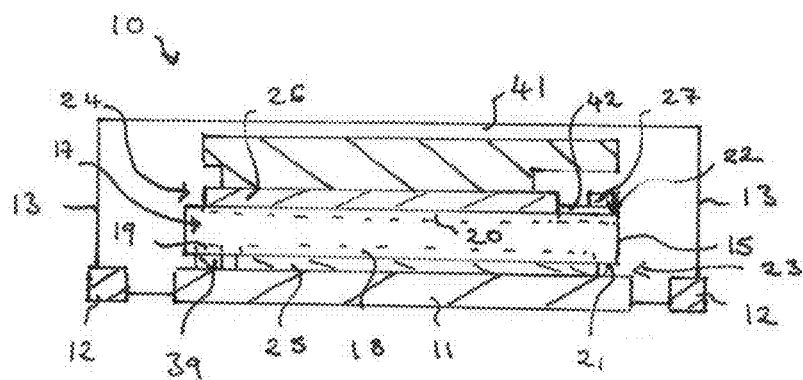

FIG. 1a illustrates a top view and FIG. 1b a cross-sectional view of a semiconductor package 10.

The semiconductor package 10 includes at least one die pad 11 and a plurality of outer contacts 12. In the package 10 illustrated in FIG. 1a, the plurality of outer contacts 12 are arranged at the peripheral edges of all four sides 13 of the semiconductor package 10. However, in other embodiments, the outer contacts 12 may have a different arrangement. For example, outer contacts may be arranged on one side only or on two opposing sides of the package 10 or a single contact, for example an elongate contact, may be arranged on one side and a plurality of contacts arranged on one or more further sides of the package 10.

The semiconductor package 10 includes a first semiconductor device 14 and a second semiconductor device 15. The semiconductor device 15 is arranged on the die pad 11. The first semiconductor device 14 may be arranged on a second die pad 16 which is spaced apart from the first die pad. The second semiconductor device 15 includes a front surface 21 and a rear surface 22. In the semiconductor package 10, the front surface 21 of the second semiconductor device 15 faces towards the die pad 11 and the rear surface 22 faces away from the die pad 11. The second semiconductor device 15 includes a first transistor device 17 which includes a source electrode 18, a gate electrode 19 and a drain electrode 20. A front metallisation 23 is arranged on the front surface 21 and a rear metallisation 24 is arranged 24 arranged on the rear surface 22. The front metallisation 23 comprises a first power contact pad 25 which is coupled to the source electrode 18. The first power contact pad 25 is mounted on the die pad 11. The rear metallisation 24 includes a second power contact pad 26 which is electrically coupled to the drain electrode 20. The rear metallisation 24 further includes an auxiliary lateral redistribution structure 27 that is electrically insulated from the second power contact pad 26 and from the drain electrode 20. The first semiconductor device 14 is electrically coupled to the auxiliary lateral redistribution structure 27.

In some embodiments, the transistor device 17 is a vertical transistor device having a vertical drift path. In a vertical transistor device, the drain electrode 20 is formed by a drain region at the rear surface 22. The source electrode 18 and gate electrode 19 are formed at the opposing front surface 21. The transistor device 17 may be a MOSFET (Metal Oxide Semiconductor Field Effect Transistor) device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

In the semiconductor package 10, the auxiliary lateral redistribution structure 27 which is arranged on the upwardly facing rear surface 22 of the second semiconductor device 15 is electrically unconnected and separate from the transistor device 17 of the second semiconductor device 15. A portion of the rear surface 22 of the second semiconductor device 15 is used as part of a lateral redistribution structure that is internal to the package 10, for example as part of a lateral redistribution structure from the first semiconductor device 14 positioned at one corner of the package 10 to an outer contact 12' positioned in the opposing corner or diagonally opposing corner of the package 10. This arrangement provides flexibility in the redistribution patterns available within the package 10 and saves space within the package, for example space required by additional long connectors such as long bond wires.

In the embodiment illustrated in FIGS. 1a-1b, the auxiliary lateral redistribution structure 27 includes an elongate conductive trace 28 which extends in a peripheral edge region of the rear surface 22 that extends along two adjoining peripheral edges of the rear surface 22 of the semiconductor device 15. In this embodiment, the conductive trace 28 extends into a contact pad 29, 30 at the two distal ends such that the contact pads 29, 30 are positioned in diagonally opposing corners of the rear surface 22 of the second semiconductor device 15. The first contact pad 29 is positioned laterally adjacent the first semiconductor device 14 so that the first semiconductor device 14 is electrically coupled to the first contact pad 29 by a relatively short electrical connector, such as a bond wire 31, extending between the first semiconductor device 14 and the contact pad 29 of the auxiliary lateral redistribution structure 27. The second contact pad 30 is electrically coupled to an outer contact 12' of the plurality of outer contacts 12 by an electrical connector such as a bond wire 32.

The first semiconductor device 14 is electrically connected by means of the bond wire 31, the first contact pad 29, the conductive trace 28, the second contact pad 31 and the bond wire 32 to the outer contact 12' which is positioned at the opposing towards the opposing side of the semiconductor package 10. The auxiliary lateral redistribution structure 27 is, this embodiment, electrically insulated from the transistor device 17 within the second semiconductor device 15 and from the semiconductor device 15 and provides a lateral conductive redistribution structure. The auxiliary lateral redistribution structure 27 may be electrically insulated from the transistor device 17 within the second semiconductor device 15 and from the second power contact pad 26 by one or more electrically insulating layers 42 positioned between the rear surface 22 and the conductive layer providing the auxiliary lateral redistribution structure 27 and, optionally between the second power contact pad 26 and the conductive layer providing the auxiliary lateral redistribution structure 27.

In some embodiments, the semiconductor package 10 includes a third semiconductor device 33. In some embodiments, the third semiconductor device 33 includes a transistor device 34. In these embodiments, the third semiconductor device may be arranged on a third die pad 35 which is laterally spaced apart from the first die pad 16 and second die pad 11. The third die pad 35 is arranged laterally adjacent to the second die pad 16 with the second and third die pads 16, 35 being arranged adjacent a common side of the first die pad 11. The second transistor device 34 may be electrically coupled to the first transistor device 17 to form a half-bridge circuit.

The second transistor device 34 may be arranged in the third semiconductor device 33 such that a third contact pad 36 connected to the source electrode is arranged on the upper surface and faces upwardly and a fourth power contact pad that is coupled to the drain electrode of the second transistor device 34 is arranged on the lower surface and is connected to the third die pad 35. In the embodiment illustrated in FIGS. 1a-1b, the second power contact pad 26, which is laterally coupled to the drain electrode 20 of the first transistor device 17, also faces upwardly. The third power contact pad 36 of the second transistor device 33 may be electrically coupled to the second power contact pad 26 of the first transistor device 17 by one or more electrical connectors, such as a contact clip 37, which extends from the third power contact pad 36 to the second power contact pad 26 to form the half-bridge circuit.

In the embodiment illustrated in FIGS. 1a-1b, the contact clip 37 further extends to the outer contact 12" that is situated at the peripheral edge of the package 10 adjacent the first die pad 11 and on the opposing side of the second semiconductor device 15 to the third semiconductor device 33 and the first semiconductor device 14. The outer contact 12" provides the output node for the half bridge circuit. In some embodiments, the first semiconductor device 14 includes gate driver circuitry for driving the gates of the first and second transistor devices 17, 34. In these embodiments, further electrical connections between the first semiconductor device 14 and the gate pads 39, 40 of the second and third semiconductor devices 15, 33 are provided. The package 10 may also include a plastic molding 41 in which the semiconductor devices 14, 15, 33 and at least portions of the die pads 11, 16, 35 and portions of the outer contacts 12 are embedded.

Figure 2:
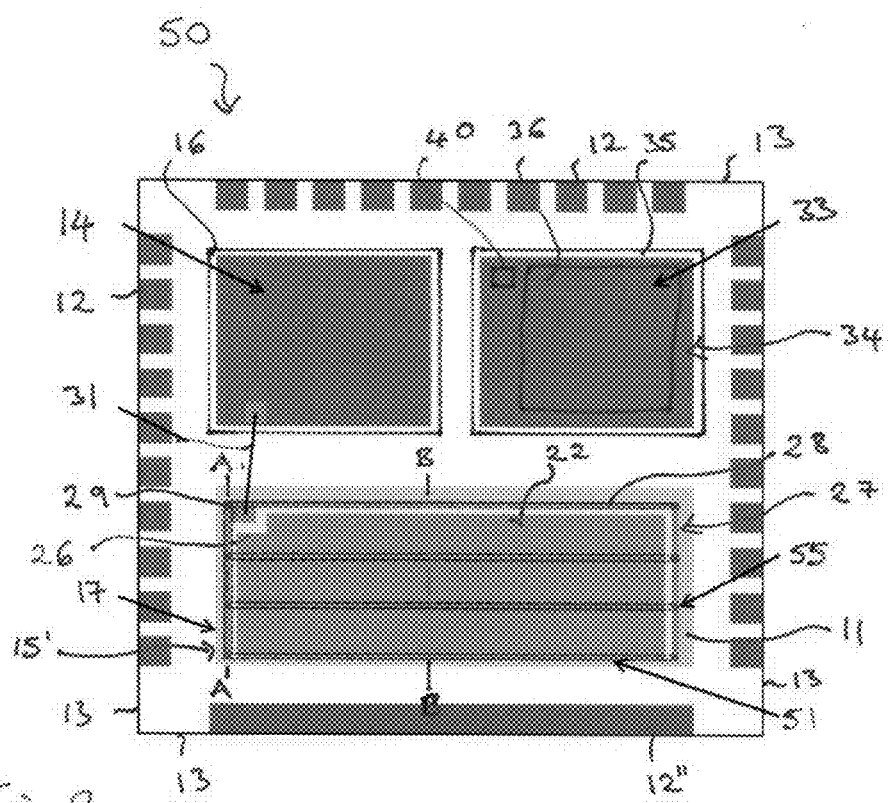
FIG. 2 illustrates a top view of a semiconductor package according to an embodiment.

FIG. 2 illustrates a top view of a semiconductor package 50 according to an embodiment. The semiconductor package 50 includes a first semiconductor device 14 arranged on the second die pad 16, a second semiconductor device 15 arranged on the first die pad 11 and a third semiconductor device 33 arranged on the third die pad 35 similar to the embodiment illustrated in FIGS. 1a-1b.

The first semiconductor device 14 may be an integrated circuit (IC) device including gate driver circuitry and the second and third semiconductor devices 15, 33 may include each include a transistor device 17, 34 similar to the embodiment illustrated in FIGS. 1a-1b. In the semiconductor device 15' differs from the semiconductor device 15 illustrated in FIGS. 1a-1b in the arrangement of the front metallisation 23 arranged on the front surface 21 and the rear metallisation 24 arranged rear surface 22 of the second semiconductor device 15'.

Figure 3A:
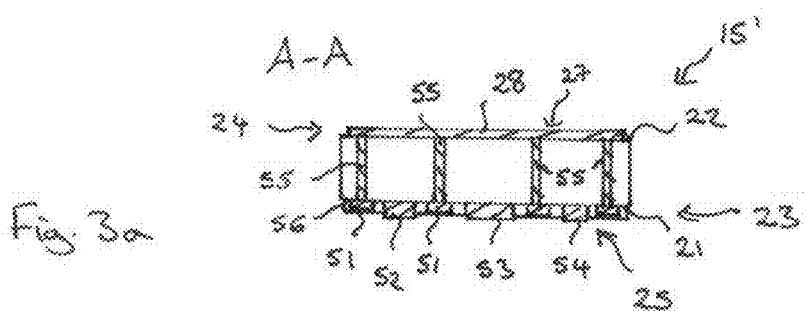
FIG. 3a illustrates a cross-sectional view along the line A-A of FIG. 2.
Figure 3B:
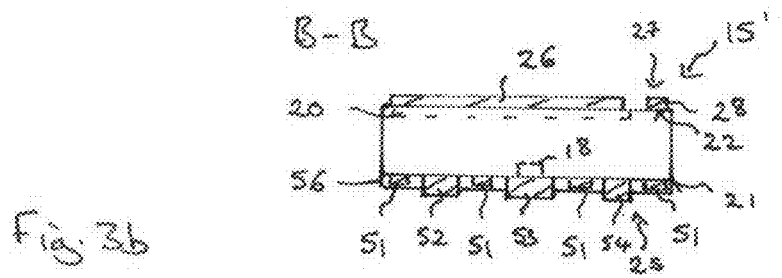
FIG. 3b illustrates a cross-sectional view along the line B-B of FIG. 2.

FIG. 3a illustrates a cross-sectional view along the line A-A and FIG. 3b a cross-sectional view along the line B-B of the semiconductor device 15'. FIG. 2 illustrates a top view looking down on the rear metallisation 24.

The front metallisation 23 includes a first power contact pad 25 that is coupled to the source electrode 18 that is divided into at least two sections 52, 53, 54. The front metallisation 23 also includes one or more gate runners 51 which have a strip-like form and are arranged between and spaced apart from the sections 52, 53, 54 of the first power contact pad 25. A gate runner 51 is arranged between neighbouring sections 52, 53 and a further gate runner 51 is arranged between the neighbouring sections 53, 54 of the first power contact pad 25. As can be seen in the top view of FIG. 2, in which the gate runners 51 are illustrated by dashed lines, the gate runners 51 extend along the entire length of the front surface 21 of the semiconductor device 15'. In the embodiment illustrated in FIGS. 2 and 3a-3b, the first power contact pad 25 is divided into three substantially parallel strip-like portions 52, 53, 54 and four strip-like gate runners 51 are provided which are positioned between the sections 52, 53 and 53, 54 of the first power contact pad 25 and in the peripheral edge regions of the front surface 21 that are positioned adjacent the two opposing peripheral edges of the front surface 21. The gate runners 51 are not be connected to one another at the front surface 21.

The rear metallisation structure 24 includes the second power contact pad 26 and an auxiliary lateral redistribution structure 27. The auxiliary lateral redistribution structure 27 includes an elongate conductive trace 28 that extends in the peripheral edge region of the rear surface 22 and along three adjoining sides towards the peripheral edge of the rear surface 22. The elongate conductive trace 28, therefore, has a general U-shape. The auxiliary lateral redistribution structure 27 is spaced apart and electrically insulated from the second power contact pad 26. The rear metallisation structure 27 also includes a contact pad 29 arranged in corner that is laterally adjacent the first transistor device 14 similar to the embodiment illustrated in FIGS. 1a-1b.

In the embodiment illustrated in FIG. 2, the auxiliary lateral redistribution structure 27 on the rear surface 22 is electrically coupled to the gate runners 51 on the front surface 21 by one or more conductive vias 55 that extend through the semiconductor body of the second semiconductor device 15. In some embodiments, a conductive via 55 is arranged at opposing ends of each of the gate runners 51 so that each end of the gate runners 51 is electrically coupled to the auxiliary lateral redistribution structure 27. The conductive vias 55 include conductive material, such as a metal, for example copper, or an alloy that is positioned in a via or through-hole that extends from the front surface 21 to the rear surface 22 and that is electrically insulated from the semiconductor body by one or more insulating layers lining the via.

The gate runners 51 positioned on the front surface 21 are electrically coupled to one another at the rear surface 22 by the auxiliary lateral redistribution structure 27. Since the gate runners 51 of the front metallisation structure are electrically coupled to the auxiliary lateral redistribution structure 27 arranged on the rear surface 22 of the semiconductor device 15, the front metallisation structure 23 may not include a gate pad or a portion of the front metallisation structure 23 for the gate electrode which is exposed from insulating material. The gate runners 51 may be completely covered by insulating material 56 so that only the sections of the first power contact pad 25 are exposed from the insulating material and electrically connected to the underlying die pad 11.

In some embodiments, the third semiconductor device 33 also includes a second transistor device 34 and has an arrangement such that the third power contact pad 36 that is coupled to the source electrode faces upwards and is electrically coupled to the second power contact pad 26 that is coupled to the drain electrode 20 of the first transistor device 17 and one or more outer contacts 12 of the semiconductor package 50 in order to provide half bridge circuit.

Figure 4:
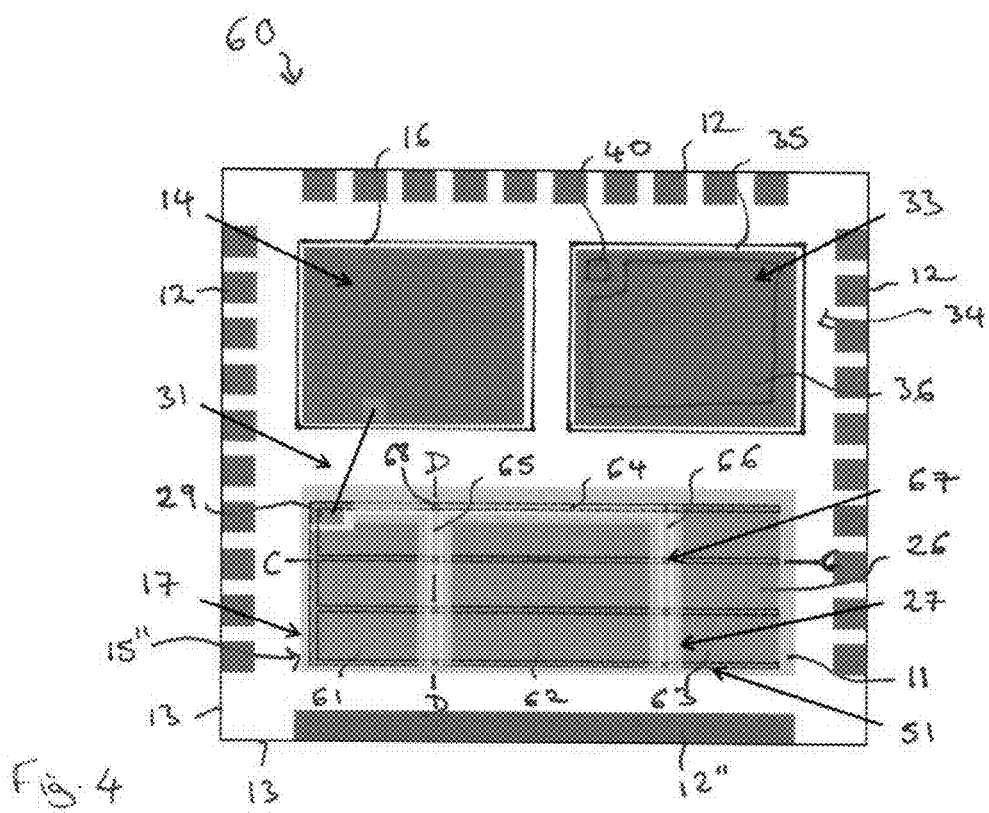
FIG. 4 illustrates a top view of a semiconductor package according to an embodiment.

FIG. 4 illustrates a top view of a semiconductor package 60 according to an embodiment. The semiconductor package 60 includes a first semiconductor device 14 arranged on the die pad 16, a second semiconductor device 15" arranged on the die pad 11 and a third semiconductor device 33 arranged on third die pad 35 similar to the embodiment illustrated in FIGS. 1a-1b and 2.

The first semiconductor device 14 may be an integrated circuit device including gate driver circuitry and the second and third semiconductor devices 15", 33 include each include a transistor device 17, 34. In the semiconductor device 15" differs from the semiconductor device 15' illustrated in FIGS. 2 and 3a-3b in the arrangement of the rear metallisation 24 arranged on the rear surface 22 of the second semiconductor device 15.

Figure 5A:
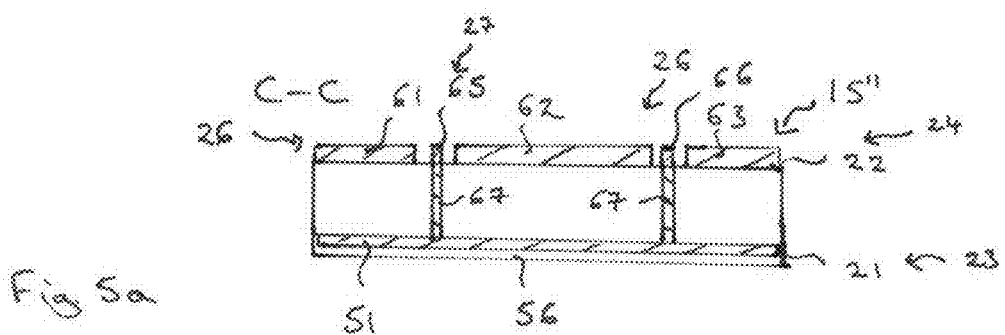
FIG. 5a illustrates a cross-sectional view along the line C-C of FIG. 4.
Figure 5B:
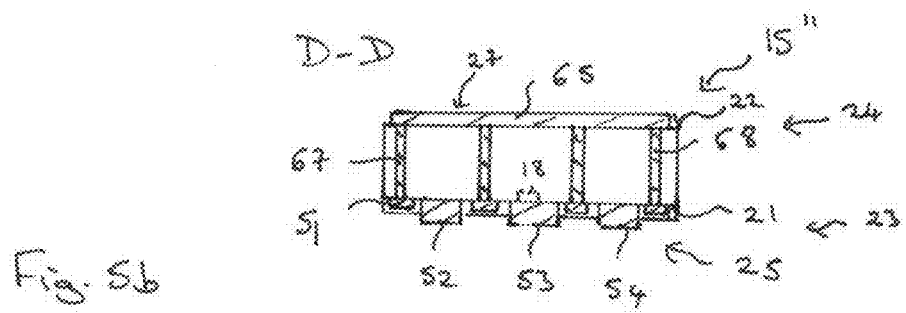
FIG. 5b illustrates a cross-sectional view along the line D-D of FIG. 2.

FIG. 5a illustrates a first cross-sectional view along the line C-C and FIG. 5b a cross-sectional view along the line D-D of the semiconductor device 15", with FIG. 4 illustrating a top view looking down on the rear metallisation structure 24.

As in the embodiment illustrated in FIGS. 2 and 3a-3b, the front metallisation 23 includes a first power contact pad 25 coupled to the source electrode 18 that is divided into three strip-like portions 52, 53, 54 and four strip-like gate runners 51 which are positioned between and spaced apart from the three strip-like sections 52, 53, 54 of the first power contact pad 25.

The rear metallisation structure 24 includes a second power contact pad 26 which is split into three sections 61, 62, 63 and an auxiliary lateral redistribution structure 27 that is spaced apart and electrically insulated from the second power contact pad 26 and the drain electrode 20. The auxiliary lateral redistribution structure 27 includes a first conductive trace 64 which is positioned in a peripheral edge region that extends along the peripheral edge of the rear surface 22 that is positioned adjacent the first semiconductor device 14 and the third semiconductor device 33. The conductive trace 64 extends into contact pad 29 which is positioned in the corner and electrically coupled to the first semiconductor device 14. The auxiliary lateral redistribution structure 27 includes two further conductive traces 65, 66 which extend perpendicularly to the first conductive trace 64 and across the width of the rear surface 22. The conductive traces 64, 65, 66 provide a redistribution structure for the gate electrode of the transistor device 17 that is positioned on the rear surface 22. The conductive traces 64, 65, 66 are spaced apart from and electrically insulated from the three sections 61, 62, 63 of the second power contact pad 26. One or more electrical insulating layers may be arranged between the each of conductive traces 64, 65, 66 and the three sections 61, 62, 63 of the second power contact pad 26.

The gate runners 51 on the front surface 21 of the semiconductor device 50 are electrically connected to each of the conductive traces 65, 66 by a conductive via 67. The outermost gate runner 51 is electrically connected to the conductive trace 64 by conductive via 68 which may be positioned at the interface between the conductive trace 64 and the conductive traces 65, 66 as illustrated in FIG. 4. Thus, each gate runner 51 is electrically coupled to the auxiliary lateral redistribution structure 27 by two conductive vias 67 positioned at different positions along the length of the gate runner 51. The conductive vias 67, 68 may be electrically insulated from the semiconductor body of the second semiconductor device 15" by one or more insulating layers lining the via in the second semiconductor device 15".

In some embodiments, the conductive trace 64 does not extend along the entire length of the peripheral edge of the transistor device 15" and may extend only to the second third conductive trace 66 from the contact pad 29. Whilst two perpendicular conductive traces 65, 66 are illustrated in FIG. 4, one perpendicular conductive trace or three or more perpendicular conductive traces may be used. In some embodiments, the positions of the conductive vias 55, 67 and 68 may be combined so that each gate runner is electrically connected to a conductive trace of the auxiliary lateral redistribution structure 27 positioned on the rear surface at the opposing ends and intermediate the length of the gate runner.

Each of the sections 61, 62, 53 of the second power contact pad 26 of the first transistor device 17 may be electrically coupled to the third power contact pad 36 of the third semiconductor device 33 and to one or more outer contacts 12" of the package 60 in order to form half bridge circuit and provide access to the node of the half bridge circuit.

Figure 6:
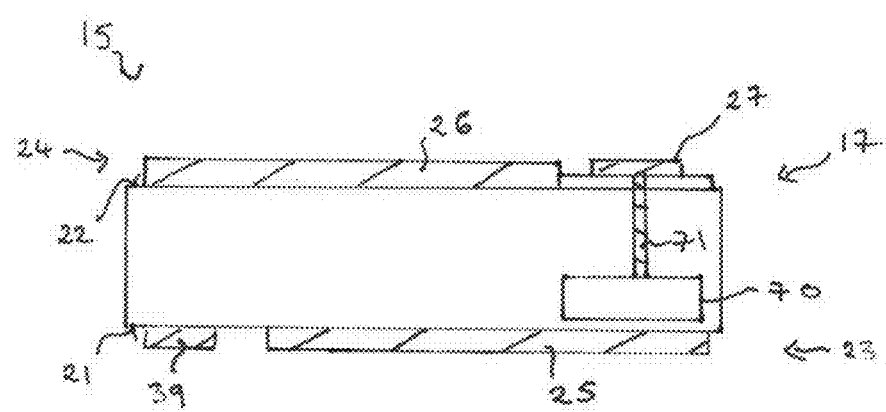
FIG. 6 illustrates a cross-sectional view of a semiconductor component which may be used in the semiconductor packages of FIGS. 1a-1b, 2 or 4.

In some embodiments, the second semiconductor device 15 includes an auxiliary structure providing another function. FIG. 6 illustrates a cross-sectional view of a second semiconductor device 15 which includes a transistor device 17 and an auxiliary structure 70. The auxiliary structure 70 is electrically coupled to the auxiliary lateral redistribution structure 27 on the rear surface 22 of the semiconductor device 15. The rear metallization 24 of the semiconductor device 15 includes a second power contact pad 26 on the upper surface 22 which is spaced apart and electrically insulated from the auxiliary lateral redistribution structure 27. The front metallisation 23 includes a gate metallisation 39 and a first power contact pad 25 on the front surface 21. The gate metallization 39 may include one or more runners 51 and the first power contact pad 25 may be split into two or more sections. The auxiliary structure 70 is electrically coupled to the auxiliary lateral redistribution structure 27 by one or more conductive vias 71.

In some embodiments, the auxiliary structure 70 is an auxiliary transistor device providing current sensing. In these embodiments, the auxiliary lateral redistribution structure 27 is electrically coupled to the source electrode of the auxiliary transistor device in order to provide current sensing. In other embodiments, the auxiliary structure 70 comprises an auxiliary transistor device providing temperature sensing.

In other embodiments, the auxiliary structure 70 is a pull-down transistor device. In embodiments in which the auxiliary structure 70 is a pull-down transistor device, the auxiliary lateral redistribution structure 27 is electrically coupled to the gate electrode of the pull-down transistor device. In some embodiments, the auxiliary lateral redistribution structure 27 includes two or more lateral redistribution structures that are electrically insulated from one another. For example, the auxiliary lateral redistribution structure may include a first redistribution structure for the transistor device 17 and a second redistribution structure for the auxiliary device 70, whereby the first and second redistribution structures may be spaced apart from one another. Each of the lateral redistribution structures may be electrically coupled to the first device 14 and/or outer contacts 12 of the package.

The semiconductor package according to any one of the embodiments described herein may be used in a SMPS (Switched Mode Power Supply) converter. In SMPS converters, switches, typically MOSFETs or IGBTs, are often arranged in a half-bridge configuration. The simplest one is the step-down converter ('buck'), which steps down voltage from its input to its output. At the same time, the current is stepped up to higher values than the supply current. In order to increase efficiency of the circuit, the low-side switch of such a half-bridge is often flipped, i.e. it is mounted source-down. The second semiconductor device 15 of FIGS. 1a to 6 is an example of such a source-down arrangement. Such a configuration allows mounting the high-side and the low-side switches closer together which in turns helps minimize the overall parasitic loop inductance. Lower loop inductance enables faster switching and eventually boosts circuit efficiency. Such an assembly concept also optimizes the area usage in the package, ultimately leading to higher power density.

As fast switching inevitably leads to higher rates of voltage and current change (dv/dt, di/dt), higher requirements are posed on the used switches, typically MOSFETs. MOSFETs need to turn-on and turn-off with minimized delay which is equivalent to homogenous transient behavior across the switch. Signal propagation times need to be as small as possible. This calls for low impedance routing of signal lines.

In addition, there is often also the demand of additional features in such MOSFETs. The most common one is the integration of a current sense, which, for example, can be realized by using a current mirror design, i.e. embedded into the main structure there is a small transistor which delivers a scaled-down copy of the current in the main switch. The drawback is the additional complexity of the chip as more signals are required resulting in additional difficulties for the signal and power routing on the chip surface.

In the embodiments described herein, the rear surface 22 of the semiconductor device 15 or chip backside is used as an additional redistribution layer. The chip may include a relatively thick backside metallization layer, typically 10 μm of copper. This metal layer can be lithographically structured creating two or more different regions. The main area is used for the drain power connection which requires a good electrical contact to the silicon substrate and the drain region of the transistor device. Other regions providing an auxiliary lateral redistribution structure, when used as signal lines, are electrically separated from the underlying silicon. This can be done by adding an isolation layer, for example a deposited oxide, beneath the metal area of the auxiliary lateral redistribution structure. Other isolation materials or stacks of materials may be used.

In some embodiments, such as the package illustrated in FIGS. 1a-1b, lateral redistribution on the chip backside to route, for example a signal from the left to the right side of a flipped chip, i.e. the chip backside is facing up, is provided. This may be used to avoid crossing wires or to keep a safe distance to other conductive elements, like clips, and the assembly in the package can be simplified. This adds flexibility in the package construction. The redistribution would not require any changes in the silicon substrate as the signal current flows only on the surface of the chip within the auxiliary lateral redistribution structure.

In some embodiments, the auxiliary lateral redistribution structure provides routing for a signal from the chip backside to the front side. This is beneficial if the aforementioned complexity of the chip makes routing on the chip front side difficult or the area consumption is significant. As there are usually less layout constraints on the chip backside, a low-impedance connection may be formed by the thick metallization layer.

FIGS. 2 to 5b illustrate an example where the gate signal is redistributed to all corners of the chip. In case of a thick backside copper layer a significantly better connection can be achieved. For example a chip having a size of 4 mm×1.25 mm with two center gate buses, for example the gate runners 51, and corner connections (similar to the one shown in FIGS. 2 and 4) has a total effective gate resistance of 699 mOhm when 8 μm wide and 3.2 μm AlCu runners are used. From this 699 mOhm, only 196 mOhm are due to the resistivity of the buried gate poly lines, the remainder of 503 mOhm is due to the metal runners. With a 25 μm wide and 10 μm thick backside copper runner, the overall effective gate resistance may be reduced to just 375 mOhm, which means that the metal contribution has been reduced to just 178 mOhm, about a third of the original value. With wider backside runners, e.g. the width of the conductive traces 28, 64, 65, 66 may be increased, the theoretical limit of a quarter will be approached for the given chip topology. Reducing the metal gate resistance becomes particularly important if the gate poly lines are replaced by other materials or material combinations, for example tungsten, as the relative contribution of the metal runners becomes bigger.

In some embodiments, such as that illustrated in FIGS. 4 and 5a-5b, one or more backside metal runners, for example the conductive traces 65, 66, extends into the chip center. Such an approach, together with a clip connection to drain, requires typically local backside passivation in order to avoid solder bridging. Routing a signal to the center of the die is particularly useful if a certain potential needs to be tapped, or if a structure needs to be attached to multiples of gate fingers. An example for this are 'pull-down'-FETs, i.e. isolated MOSFETs which make sure that the gate remains at source potential in off-state during fast transients, i.e. to avoid unwanted turn-on due to displacement currents. An example is illustrated in FIG. 6.

Such auxiliary transistors require the gate potential (present at the front side gate buses), the source potential (available almost everywhere on the chip frontside), and a GATE # signal, which is more or less the inverted gate signal and needs to be supplied from a driver IC. In FIG. 6, these 'pull-down'-FETs are located at the gate buses and their gates are controlled from the chip backside using conductive vias. There is a multitude of such 'pull-down'-transistors to properly short the gate and source everywhere. A passivation layer may be used on top of the redistribution layer. Passivation could be created using, for example, epoxy or imide. FIG. 6 illustrates an example with 'pull-down'-FETs distributed over the chip. Eight such structures are integrated, all at the gate runners on the chip frontside. The 'pull-down'-FETs get their gate signal (GATE #) through silicon-through-vias from the chip backside where a metal runner is routed to a pad connected to the gate driver.

On a system level, such backside redistribution layers provide significant benefits as they allow a very low-ohmic gate connection which is needed for ultra-fast switching. Also, 'pull-down'-FETs can be integrated in a very efficient way without major area loss due to the additional GATE # connections. By that, certain boundary conditions are significantly relaxed, which in turn offers further room for transistor optimization. Eventually, higher efficiency can be achieved which enables higher switching frequency and more compact board designs.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   at least one die pad;
   a plurality of outer contacts;
   a first semiconductor device; and
   a second semiconductor device comprising a first transistor device having a source electrode, a gate electrode, a drain electrode, a front surface, a rear surface, a front metallization on the front surface, and a rear metallization on the rear surface,
   wherein the front metallization comprises a first power contact pad coupled to the source electrode,
   wherein the first power contact pad is mounted on the at least one die pad,
   wherein the rear metallization comprises a second power contact pad electrically coupled to the drain electrode and an auxiliary lateral redistribution structure electrically insulated from the second power contact pad and the drain electrode,
   wherein the first semiconductor device is electrically coupled to the auxiliary lateral redistribution structure.

2. The semiconductor package of claim 1, wherein the auxiliary lateral redistribution structure comprises a conductive trace extending into a contact pad at one or two ends of the conductive trace.

3. The semiconductor package of claim 1, wherein the first semiconductor device is electrically coupled to an outer contact by way of the auxiliary lateral redistribution structure on the second semiconductor device, and wherein the auxiliary lateral redistribution structure is operably unconnected to the second transistor device.

4. The semiconductor package of claim 1, wherein the first semiconductor device comprises gate driver circuitry electrically coupled to a gate electrode of the first transistor device by way of the auxiliary lateral redistribution structure.

5. The semiconductor package of claim 1, wherein the second semiconductor device further comprises at least one through substrate via extending from the rear surface to the front surface, and wherein the at least one through substrate via is electrically coupled to the auxiliary lateral redistribution structure on the rear surface.

6. The semiconductor package of claim 5, wherein the at least one through substrate via is further electrically coupled to a gate runner on the front surface and that is electrically coupled to a gate electrode of the first transistor device.

7. The semiconductor package of claim 6, wherein the second power contact pad on the rear surface is split into two or more sections, wherein the auxiliary lateral redistribution structure comprises a first conductive trace positioned between, and electrically insulated from, two neighbouring sections of the second power contact pad and a second conductive trace that is arranged in a peripheral edge region of the rear surface and that is connected to the first conductive trace, and wherein the at least one through substrate via extends between the first conductive trace on the rear surface and the gate runner on the front surface, or between the second conductive trace on the rear surface and the gate runner on the front surface.

8. The semiconductor package of claim 7, wherein the gate runner on the front surface extends substantially perpendicular to the first conductive trace on the rear surface, and wherein the at least one through substrate via extends between the first conductive trace and the gate runner.

9. The semiconductor package of claim 1, wherein the second semiconductor device further comprises an auxiliary structure, and wherein the auxiliary lateral redistribution structure is electrically coupled to the auxiliary structure.

10. The semiconductor package of claim 9, wherein the auxiliary structure is an auxiliary transistor device providing current sensing, or an auxiliary transistor device providing temperature sensing, or a pull-down auxiliary transistor device.

11. The semiconductor package of claim 1, further comprising a third semiconductor device comprising a second transistor device, wherein the first transistor device and the second transistor device are coupled to form a half bridge, and wherein the first semiconductor device comprises gate driver circuitry.

12. A semiconductor component, comprising:
    a transistor device comprising a front surface, a rear surface, a source electrode, a gate electrode, a drain electrode, a front metallization on the front surface, and a rear metallization on the rear surface,
    wherein the front metallization comprises a first power contact pad coupled to the source electrode,
    wherein the rear metallization comprises a second power contact pad arranged on and electrically coupled to the drain electrode, and an auxiliary lateral redistribution structure electrically insulated from the power contact pad and the drain electrode.

13. The semiconductor component of claim 12, further comprising an auxiliary structure, wherein the auxiliary structure is electrically coupled to the auxiliary lateral redistribution structure.

14. The semiconductor component of claim 12, wherein the first power contact pad is spilt into two or more sections, wherein the front metallization comprises one or more gate runners arranged between two sections of the first power contact pad, and wherein the one or more gate runners are electrically coupled to the gate electrode of the transistor device and to one another by way of the auxiliary lateral redistribution structure.

15. The semiconductor component of claim 12, wherein the second power contact pad on the rear surface is split into two or more sections, and wherein the auxiliary lateral redistribution structure comprises a conductive trace positioned between, and electrically insulated from, two neighbouring sections of the second power contact pad.

* * * * *